(12) United States Patent
Chou et al.

(10) Patent No.: US 9,196,360 B2
(45) Date of Patent: Nov. 24, 2015

(54) OPERATING RESISTIVE MEMORY CELL (71) Applicant: Taiwan Semiconductor Manufacturing CO., LTD., Hsinchu (TW)

(72) Inventors: Chung-Cheng Chou, Hsinchu (TW); Yue-Der Chih, Hsinchu (TW)

(73) Assignee: Taiwan Semiconductor Manufacturing Co., Ltd., Hsinchu (TW)

( * ) Notice: Subject to any disclaimer, the term of this patent is extended or adjusted under 35 U.S.C. 154(b) by 47 days.

(21) Appl. No.: 14/161,193

(22) Filed: Jan. 22, 2014

(65) Prior Publication Data
US 2015/0206583 A1 Jul. 23, 2015

(51) Int. Cl.
*G11C 13/00* (2006.01)
*H03K 17/56* (2006.01)
*G11C 11/56* (2006.01)

(52) U.S. Cl.
CPC ............ *G11C 13/0064* (2013.01); *G11C 11/56* (2013.01); *G11C 13/0007* (2013.01); *G11C 13/0069* (2013.01); *H03K 17/56* (2013.01); *G11C 2013/0066* (2013.01); *G11C 2013/0078* (2013.01); *G11C 2213/79* (2013.01)

(58) Field of Classification Search
CPC ................... G11C 13/0069; G11C 2013/0078; G11C 11/56; G11C 5/147; H03K 17/56; G06G 7/28; H01L 27/0629; H01L 27/0921; H01L 27/0811
See application file for complete search history.

(56) References Cited

U.S. PATENT DOCUMENTS

| 8,059,447 B2 * | 11/2011 | Scheuerlein et al. | 365/148 |
| 2004/0130473 A1 * | 7/2004 | Snoeijs | 341/158 |
| 2010/0085794 A1 * | 4/2010 | Chen et al. | 365/148 |
| 2011/0084732 A1 * | 4/2011 | Abuelma'Atti et al. | 327/105 |
| 2013/0235648 A1 * | 9/2013 | Kim et al. | 365/148 |

* cited by examiner

Primary Examiner — Richard Elms
Assistant Examiner — Ajay Ojha (57) ABSTRACT

A circuit that includes a current source and a current comparator is disclosed. The current source is connected to a resistive memory cell to generate a driving current thereto. The current comparator has a sensing node connected to the current source and the resistive memory cell to sense an injection current injected to the current comparator through the sensing node, wherein when a resistive state of the resistive memory cell switches such that the current comparator determines that an amount of the injection current increases to exceed or decreases to reach threshold value, the current comparator turns off the current source.

20 Claims, 5 Drawing Sheets

OPERATING RESISTIVE MEMORY CELL

BACKGROUND

Resistive random access memory (RRAM) devices include resistive memory cells that store data based on a resistance level of a storage element. The cells are operatively programmed to a desired state corresponding to a particular resistance level. In some approaches, the cells are programmed by applying positive or negative voltages to the cells for a particular duration.

BRIEF DESCRIPTION OF THE DRAWINGS

The disclosure can be more fully understood by reading the following detailed description of the embodiment, with reference made to the accompanying drawings as follows.

DETAILED DESCRIPTION

Reference will now be made in detail to the present embodiments of the disclosure, examples of which are illustrated in the accompanying drawings. Wherever possible, the same reference numbers are used in the drawings and the description to refer to the same or like parts.

In the following description, specific details are presented to provide a thorough understanding of the embodiments of the present disclosure. Persons of ordinary skill in the art will recognize, however, that the present disclosure can be practiced without one or more of the specific details, or in combination with other components. Well-known implementations or operations are not shown or described in detail to avoid obscuring aspects of various embodiments of the present disclosure.

The terms used in this specification generally have their ordinary meanings in the art and in the specific context where each term is used. The use of examples in this specification, including examples of any terms discussed herein, is illustrative only, and in no way limits the scope and meaning of the disclosure or of any exemplified term. Likewise, the present disclosure is not limited to various embodiments given in this specification.

It will be understood that, although the terms "first," "second," etc., may be used herein to describe various elements, these elements should not be limited by these terms. These terms are used to distinguish one element from another. For example, a first element could be termed a second element, and, similarly, a second element could be termed a first element, without departing from the scope of the embodiments. As used herein, the term "and/or" includes any and all combinations of one or more of the associated listed items.

As used herein, the terms "comprising," "including," "having," "containing," "involving," and the like are to be understood to be open-ended, i.e., to mean including but not limited to.

Reference throughout the specification to "one embodiment" or "an embodiment" means that a particular feature, structure, implementation, or characteristic described in connection with the embodiment is included in at least one embodiment of the present disclosure. Thus, uses of the phrases "in one embodiment" or "in an embodiment" in various places throughout the specification are not necessarily all referring to the same embodiment. Furthermore, the particular features, structures, implementation, or characteristics may be combined in any suitable manner in one or more embodiments.

Figure 1:
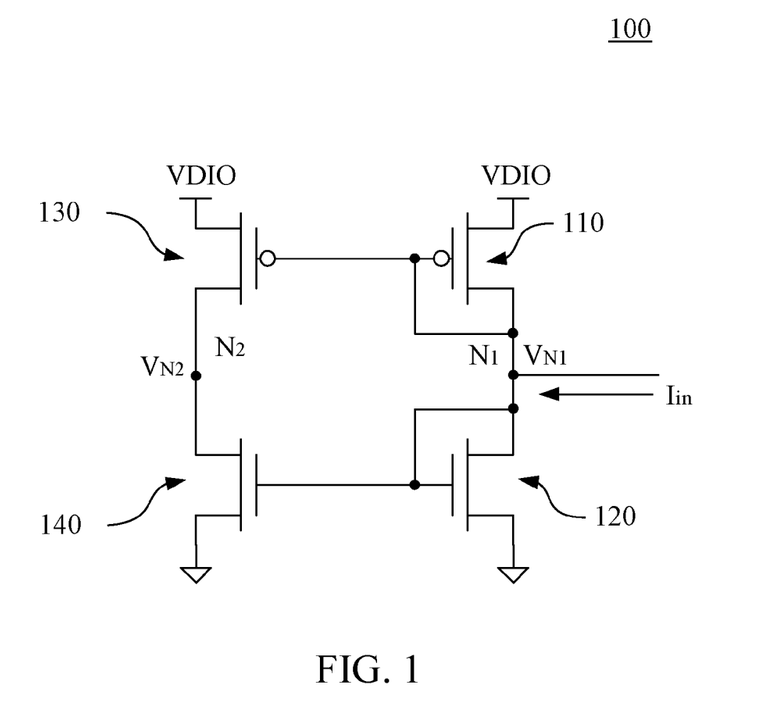
FIG. 1 is an exemplary diagram of a current comparator in accordance with various embodiments of the present disclosure.

FIG. 1 is an exemplary diagram of a current comparator 100 in accordance with various embodiments of the present disclosure.

The current comparator 100 includes a diode-connected P-type metal-oxide-semiconductor (PMOS) transistor 110, a diode-connected N-type metal-oxide-semiconductor (NMOS) transistor 120, a P-type metal-oxide-semiconductor (PMOS) transistor 130 and an N-type metal-oxide-semiconductor (NMOS) transistor 140.

As illustrated in FIG. 1, the diode-connected P-type metal-oxide-semiconductor (PMOS) transistor 110 and the diode-connected N-type metal-oxide-semiconductor (NMOS) transistor 120 are cascade-connected at a sensing node $N_1$.

The P-type metal-oxide-semiconductor (PMOS) transistor 130 and the N-type metal-oxide-semiconductor (NMOS) transistor 140 are cascade-connected at an output node $N_2$. The gates of the diode-connected P-type metal-oxide-semiconductor (PMOS) transistor 110 and the P-type metal-oxide-semiconductor (PMOS) transistor 130 are connected. The gates of the diode-connected N-type metal-oxide-semiconductor (NMOS) transistor 120 and the N-type metal-oxide-semiconductor (NMOS) transistor 140 are connected.

In some embodiments, an injection current $I_{in}$ is injected to the current comparator 100 through the sensing node $N_1$, and the diode-connected P-type metal-oxide-semiconductor (PMOS) transistor 110 operates with the diode-connected N-type metal-oxide-semiconductor (NMOS) transistor 120 to sense injection current $I_{in}$ at the sensing node $N_1$. In operation, when an amount of the injection current $I_{in}$ increases to exceed or decreases to reach a threshold value, a voltage state of a voltage $V_{N2}$ of the output node $N_2$ switches. In some embodiments, the threshold value is zero.

In operation, when the amount of the injection current $I_{in}$ is initially larger than the threshold value, the voltage $V_{N1}$ of the sensing node $N_1$ increases due to the injection current $I_{in}$. Furthermore, the voltage at the gates of both the diode-connected P-type metal-oxide-semiconductor (PMOS) transistor 110 and the P-type metal-oxide-semiconductor (PMOS) transistor 130 increase at the same time, due to the injection current $I_{in}$. As a result, the diode-connected P-type metal-oxide-semiconductor (PMOS) transistor 110 and the P-type metal-oxide-semiconductor (PMOS) transistor 130 are in a low conduction state according to the gate voltage.

Moreover, the current generated by the P-type metal-oxide-semiconductor (PMOS) transistor 130 does not match the current-draining ability of the N-type metal-oxide-semiconductor (NMOS) transistor 140. As a result, the voltage $V_{N2}$ of the output node $N_2$ is pulled low by the N-type metal-oxide-semiconductor (NMOS) transistor 140.

When the amount of the injection current $I_{in}$ decreases to reach the threshold value, the voltage $V_{N1}$ of the sensing node $N_1$ decreases. As a result, the diode-connected P-type metaloxide-semiconductor (PMOS) transistor 110 and the P-type metal-oxide-semiconductor (PMOS) transistor 130 are in a higher conduction state. The current generated by the P-type metal-oxide-semiconductor (PMOS) transistor 130 matches the current-draining ability of the N-type metal-oxide-semiconductor (NMOS) transistor 140 and further pull high the voltage $V_{N2}$ of the output node $N_2$. As a result, the voltage state of the voltage $V_{N2}$ of the output node $N_2$ switches from the low voltage state to a high voltage state.

On the other hand, when the injection current $I_{in}$ then increases to exceed the threshold value, the diode-connected P-type metal-oxide-semiconductor (PMOS) transistor 110 and the P-type metal-oxide-semiconductor (PMOS) transistor 130 are in the low conduction state again. As a result, the voltage $V_{N2}$ of the output node $N_2$ is pulled low by the N-type metal-oxide-semiconductor (NMOS) transistor 140. The voltage state of the voltage $V_{N2}$ of the output node $N_2$ switches from the high voltage state to the low voltage state.

In some embodiments, the injection current $I_{in}$ is of a negative value. Explained in a different way, the injection current $I_{in}$ is sourced from the current comparator 100 through the sensing node $N_1$. In operation, when an amount of the injection current $I_{in}$ increases to exceed or decreases to reach a threshold value, the voltage state of the voltage $V_{N2}$ of the output node $N_2$ switches. In some embodiments, the threshold value is zero.

In operation, when the amount of the injection current $I_{in}$ is initially larger than threshold value, the injection current $I_{in}$ decreases the voltage $V_{N1}$ of the sensing node $N_1$ and the voltage at the gates of both the diode-connected P-type metal-oxide-semiconductor (PMOS) transistor 110 and the P-type metal-oxide-semiconductor (PMOS) transistor 130 at the same time. As a result, the diode-connected P-type metal-oxide-semiconductor (PMOS) transistor 110 and the P-type metal-oxide-semiconductor (PMOS) transistor 130 are in a high conduction state according to the decreased gate voltage.

Moreover, the current generated by the P-type metal-oxide-semiconductor (PMOS) transistor 130 matches the current-draining ability of the N-type metal-oxide-semiconductor (NMOS) transistor 140 and pull high the voltage $V_{N2}$ of the output node $N_2$.

When the amount of the injection current $I_{in}$ decreases to reach the threshold value, the voltage $V_{N1}$ of the sensing node $N_1$ increases such that the diode-connected P-type metal-oxide-semiconductor (PMOS) transistor 110 and the P-type metal-oxide-semiconductor (PMOS) transistor 130 are in a lower conduction state. In some embodiments, the P-type metal-oxide-semiconductor (PMOS) transistor 130 is designed such that the current generated therefrom in the lower conduction state does not match the current-draining ability of the N-type metal-oxide-semiconductor (NMOS) transistor 140. As a result, the voltage $V_{N2}$ of the output node $N_2$ is pulled low by the N-type metal-oxide-semiconductor (NMOS) transistor 140. The voltage state of the voltage $V_{N2}$ of the output node $N_2$ switches from the high voltage state to the low voltage state.

On the other hand, when the injection current $I_{in}$ increases to exceed the threshold value, the diode-connected P-type metal-oxide-semiconductor (PMOS) transistor 110 and the P-type metal-oxide-semiconductor (PMOS) transistor 130 are in the high conduction state again. As a result, the voltage $V_{N2}$ of the output node $N_2$ is pulled high by the P-type metal-oxide-semiconductor (PMOS) transistor 130. The voltage state of the voltage $V_{N2}$ of the output node $N_2$ switches from the low voltage state to the high voltage state.

Based on the operation of the current comparator 100, the current comparator 100 compares the amount of the injection current $I_{in}$ with a threshold value to determine whether the voltage state of the voltage $V_{N2}$ of the output node $N_2$ is to be switched.

Figure 2:
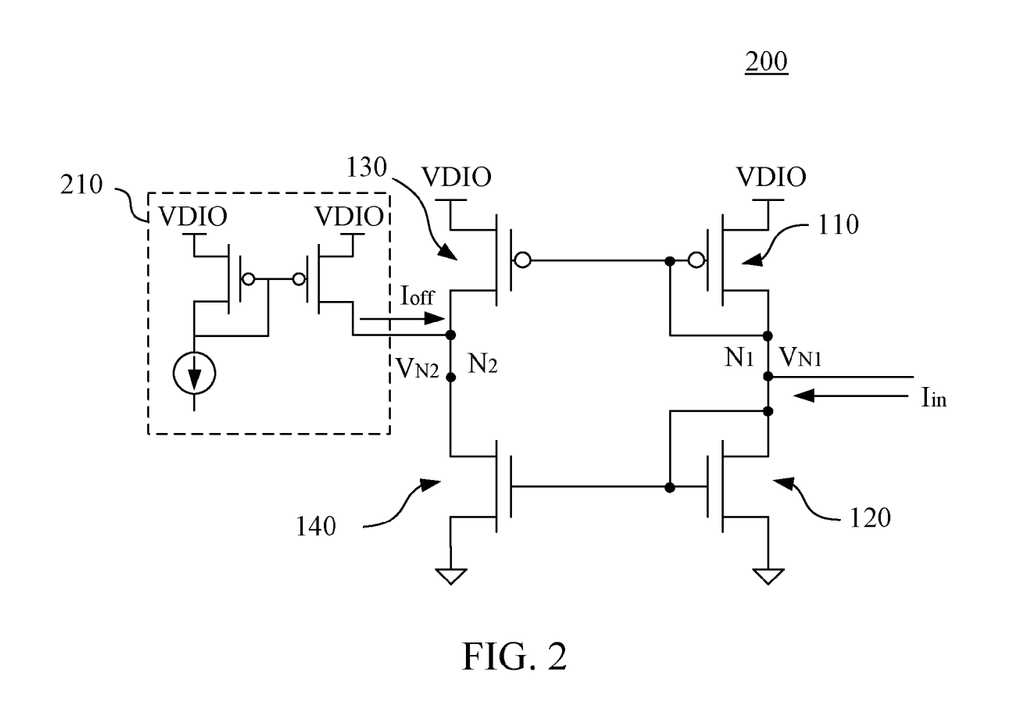
FIG. 2 is an exemplary diagram of a current comparator in accordance with various embodiments of the present disclosure.

FIG. 2 is an exemplary diagram of a current comparator 200 in accordance with various embodiments of the present disclosure.

The current comparator 200 substantially includes the same components as those of the current comparator 100. In addition, the current comparator 200 further includes a bias current source 210. In some embodiments, the bias current source 210 is connected to the output node $N_2$ to generate an offset current $I_{off}$ thereto. The offset current $I_{off}$ not only increases the voltage $V_{N2}$ of the output node $N_2$ but also aids the current-supplying ability of the P-type metal-oxide-semiconductor (PMOS) transistor 130. As a result, the threshold value increases since the amount of the injection current $I_{in}$ increases to a higher value to force the conduction state of the P-type metal-oxide-semiconductor (PMOS) transistor 130 low enough.

Similarly, when another bias current source (not illustrated) is presented and configured to drain an offset current from the output node $N_2$, the offset current decreases the threshold voltage.

Figure 3:
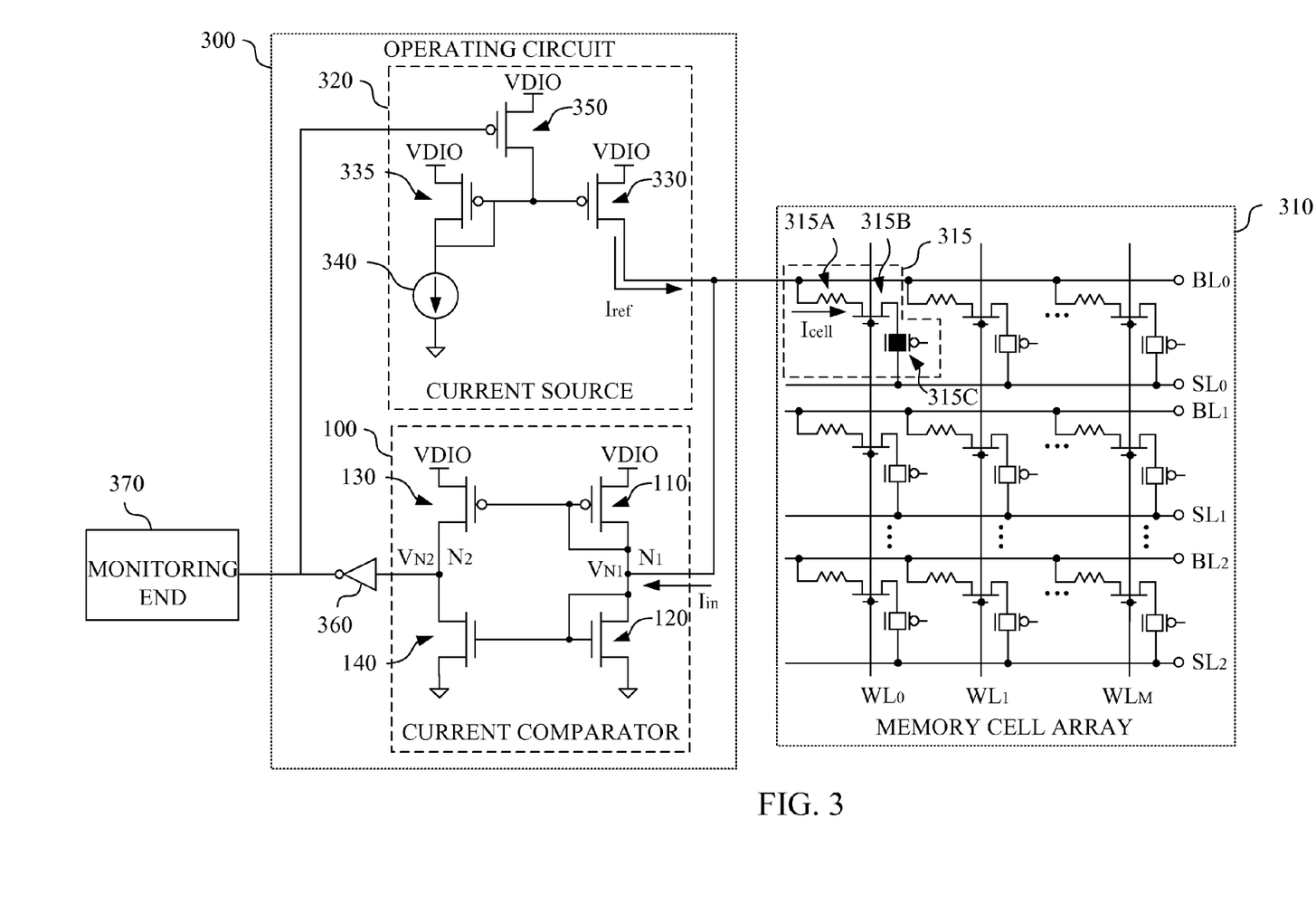
FIG. 3 is an exemplary diagram of an operating circuit together with the resistive memory cell array in accordance of various embodiments of the present disclosure.

FIG. 3 is an exemplary diagram of an operating circuit 300 together with a resistive memory cell array 310, in accordance with various embodiments of the present disclosure. In some embodiments, the operating circuit 300 operates the resistive memory cell array 310.

The resistive memory cell array 310 includes resistive memory cells 315. For illustration, the resistive memory cells 315 are disposed at intersections of the word lines $WL_0$, $WL_1$, ... and $WL_M$ and the bit lines $BL_0$, $BL_1$, ... and $BL_N$, respectively, in a matrix of rows and columns. For convenience of illustration, only one reference number 315 is labeled in FIG. 3.

For illustration in FIG. 3, each of the word lines $WL_0$-$WL_M$ is electrically connected to a respective column of the resistive memory cells 315. Each of the bit lines $BL_0$-$BL_N$ is electrically connected to a respective row of the resistive memory cells 315. The source lines $SL_0$-$SL_N$ are disposed in the same direction as the bit lines $BL_0$-$BL_N$. Each of the source lines $SL_0$-$SL_N$ is electrically connected to a respective row of the resistive memory cells 315.

In some embodiments, each of the resistive memory cells 315 includes a resistive random access memory (RRAM) device 315A, an access transistor 315B and a transmission gate 315C that are connected in series. Each of the resistive memory cells 315 in a row is connected between a corresponding bit line and a corresponding source line. For illustration, the resistive memory cells 315 in a first row are connected between the bit line $BL_0$ and the source line $SL_0$.

Different operations of the resistive memory cells 315, such as a forming operation, a set operation and a reset operation, are performed with different voltages and currents applied on the resistive memory cells 315.

In some embodiments, a resistive memory cell 315 in a row is conducted when the access transistor 315B and the transmission gate 315C thereof are activated. For illustration, the corresponding bit line associated with the conducted resistive memory cell 315 is driven by a driving current $I_{ref}$ in FIG. 3. The set operation or the forming operation of the conducted resistive memory cell 315 is performed according to the driving current $I_{ref}$. More specifically, when a resistive memory cell 315 is conducted, the resistive state of the resistive random access memory (RRAM) device 315A gradually switches from a high resistive state to a low resistive state according to the driving current $I_{ref}$.

In some embodiment, the resistance of the access transistor 315B and the transmission gate 315C are neglected. As a result, the resistance of the resistive memory cell 315 is substantially the same as that of the resistive random access memory (RRAM) device 315A. The resistive state of the resistive memory cell 315 gradually switches from a high resistive state to a low resistive state according to the driving current $I_{ref}$ at the same time.

For illustration in FIG. 3, the operating circuit 300 is configured to operate the resistive memory cells 315, and the driving current $I_{ref}$ is generated by the operating circuit 300. Effectively, each of the bit lines $BL_0$-$BL_N$ is connected to a corresponding operating circuit. However, only the operating circuit 300 corresponding to the bit line $BL_0$ is exemplarily illustrated in FIG. 3, for convenience of illustration.

The operating circuit 300 includes a current source 320 and a current comparator 100. The current source 320 is connected with the current comparator 100 and one of the bit lines $BL_0$-$BL_N$. The current source 320 is configured to generate the driving current $I_{ref}$ for corresponding one of the bit lines $BL_0$-$BL_N$. The current comparator 100 is coupled to the current source 320 and is configured to sense an injection current $I_{in}$ injected to the current comparator 100 through the sensing node $N_1$. Moreover, the current comparator 100 is configured to turn off the current source 320 when the injection current $I_{in}$ increases to exceed a threshold value.

In some embodiments, the current source 320 includes a current mirror that includes an output branch and a reference branch. The output branch includes a transistor 330. The reference branch includes a transistor 335 and a current source 340 connected in series. The transistor 330 is configured to generate the driving current $I_{ref}$ according to the current of the current source 340 and size ratios of the transistor 330 and the transistor 335. In some embodiments, the size ratios include the ratios of widths and lengths (e.g., W/L) of channels of the transistor 330 and the transistor 335 respectively.

In some embodiments, the current source 320 further includes a control switch 350 connected to the gate of the transistor 330 and the gate of the transistor 335 to control the operation of the transistor 330. Under different conditions, the control switch 350 either turns on the transistor 330 to generate the driving current $I_{ref}$ or turns off the transistor 330 to stop generating the driving current $I_{ref}$.

The current comparator 100 in FIG. 3 is the same as that illustrated in FIG. 1. As illustrated in FIG. 3, the sensing node $N_1$ of the current comparator 100 is further connected to the current source 320 and the resistive memory cell array 310. Moreover, in some embodiments, the output node $N_2$ is further connected to the control switch 350 included in the current source 320 through an inverter 360. For illustration in FIG. 3, the control switch 350 is controlled, through the inverter 360, by the voltage $V_{N2}$ of the output node $N_2$, and then the control switch 350 further controls the operation of the transistor 330.

Figure 4:
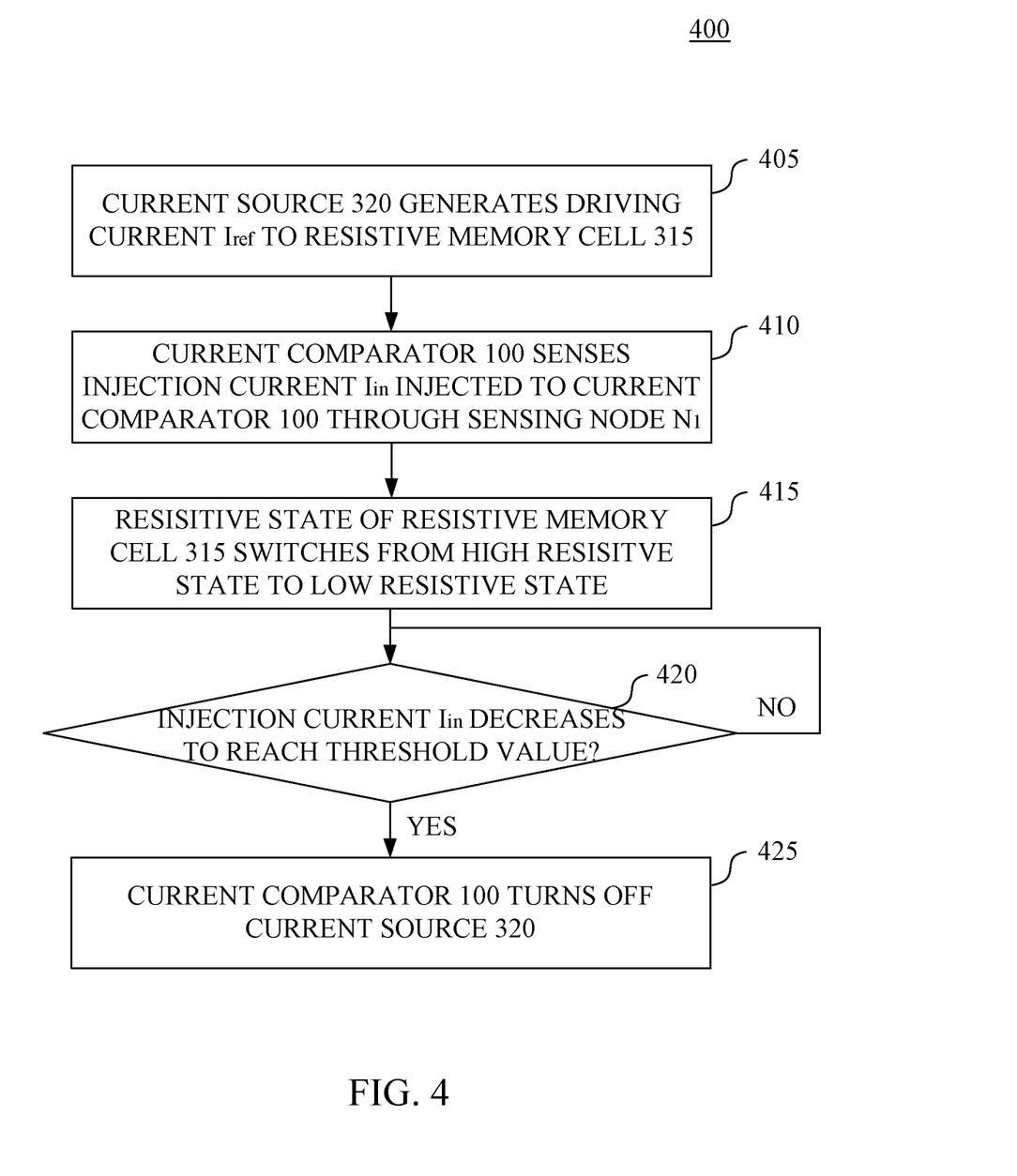
FIG. 4 is a flow chart of an operating method in accordance with various embodiments of the present disclosure.

FIG. 4 is a flow chart of an operating method 400 in accordance with various embodiments of the present disclosure. In some embodiments, the operating method 400 is applied in the operating circuit 300 with one of the resistive memory cells 315 illustrated in FIG. 3. For illustration, operations of the operating circuit 300 with one of the resistive memory cells 315 illustrated in FIG. 3 are described by the operating method 400.

In operation 405, the current source 320 generates the driving current $I_{ref}$ to a conducted resistive memory cell 315. More specifically, the transistor 330 of the current source 320 generates the driving current $I_{ref}$ to the conducted resistive memory cell 315. For illustration, one of the resistive memory cells 315 in FIG. 3 is conducted to perform the set operation or the forming operation.

For illustration in FIG. 3, the resistive memory cell 315 associated with the bit line $BL_0$ and the word line $WL_0$ is conducted. In such condition, the access transistor 315B and the transmission gate 315C are activated. As a result, the resistive random access memory (RRAM) device 315A is conducted. Consequently, the resistive memory cell 315 is conducted, and a current $I_{cell}$ flows through the conducted resistive memory cell 315. In some embodiments, the current $I_{cell}$ flows from the bit line $BL_0$ to the source line $SL_0$.

In operation 410, the current comparator 100 senses an injection current $I_{in}$ injected to the current comparator 100 through the sensing node $N_1$.

When the resistive memory cell 315 is in a high resistive state, the resistive memory cell 315 only drains a small amount of the current $I_{cell}$. As a result, a part of the driving current $I_{ref}$ is injected to the sensing node $N_1$ such that the current comparator 100 senses the injection current $I_{in}$.

The voltage $V_{N1}$ of the sensing node $N_1$ and the voltage at the gates of both the diode-connected P-type metal-oxide-semiconductor (PMOS) transistor 110 and the P-type metal-oxide-semiconductor (PMOS) transistor 130 increase at the same time due to the presence of the injection current $I_{in}$. As a result, the diode-connected P-type metal-oxide-semiconductor (PMOS) transistor 110 and the P-type metal-oxide-semiconductor (PMOS) transistor 130 are in a lower conduction state according to the increased gate voltage. Moreover, the voltage $V_{N2}$ of the output node $N_2$ is pulled low by the N-type metal-oxide-semiconductor (NMOS) transistor 140. The control switch 350 is turned off by the inverse of the voltage $V_{N2}$ of the output node $N_2$ to keep turning on the current source 320. More specifically, the control switch 350 is turned off to keep turning on the transistor 330 of the current source 320.

In operation 415, a resistive state of the resistive memory cell 315 switches from a high resistive state to a low resistive state according to the driving current $I_{ref}$.

For illustration, when the current source 320 keeps generating the driving current $I_{ref}$, the corresponding resistive memory cell 315 gradually switches from the high resistive state to the low resistive state. As a result, the current $I_{cell}$ drained by the resistive memory cell 315 increases such that the injection current $I_{in}$ injected to the current comparator 100 decreases.

In operation 420, whether an amount of the injection current $I_{in}$ decreases to reach a threshold value is determined when the resistive state of the resistive memory cell 315 switches from the high resistive state to the low resistive state.

In some embodiments, the threshold value is zero. Explained in a different way, whether the amount of the injection current $I_{in}$ becomes zero is determined. In some embodiments, the transistor 330 of the current source 320 is initially operated in a linear region, such that the driving current $I_{ref}$ is increased, and the current $I_{cell}$ is accordingly increased. The transistor 330 is further operated in the saturation region when the current $I_{cell}$ becomes large enough. Moreover, when the driving current $I_{ref}$ is all drained by the resistive memory cell 315, the injection current $I_{in}$ becomes zero.

In operation 425, the current comparator 100 turns off the current source 320 when the amount of the injection current $I_{in}$ reaches the threshold value.

When the amount of the injection current $I_{in}$ reaches zero, both the diode-connected P-type metal-oxide-semiconductor (PMOS) transistor 110 and the P-type metal-oxide-semiconductor (PMOS) transistor 130 turn on. As a result, the voltage state of the voltage $V_{N2}$ of the output node $N_2$ is switched from a low voltage state to a high voltage state, and the output of the inverter 360 is at a low voltage state. Moreover, the control switch 350 is turned on by the output of the inverter 360, such that the control switch 350 pulls the gate voltages of the transistor 330 and the transistor 335 up to a high level, in order to turn off the transistor 330 and the transistor 335. As a result, the current source 320 is turned off.

On the contrary, if it is determined that the amount of the injection current $I_{in}$ does not reach the threshold value in operation 415, the current comparator 100 keeps turning on the current source 320 until the injection current $I_{in}$ reaches the threshold value.

Based on the operation of the operating circuit 300, the current comparator 100 turns off the current source 320 after the resistive state of the resistive memory cell 315 switches. As a result, the resistive memory cell 315 is not suffered from the over-set or over-forming condition.

In some embodiments, when the $V_{N2}$ of the output node $N_2$ switches, the switched voltage $V_{N2}$ serves as an inhibiting signal. More specifically, in some further embodiments, the inverse of the voltage $V_{N2}$ is transmitted to a monitoring end 370 to notify the monitoring end 370 that an operation of the current source 320 and the resistive memory cell 315 is done. Once the monitoring end 370 is notified, the user is aware that the resistive state of the resistive memory cell 315 is switched.

The amount of the threshold value therein in this document are for illustrative purposes. Various amounts of the threshold value therein are within the contemplated scope of the present disclosure. In some embodiments, the amount of the threshold value is modified by using different size ratios of the MOS transistors in the current comparator 100.

Figure 5:
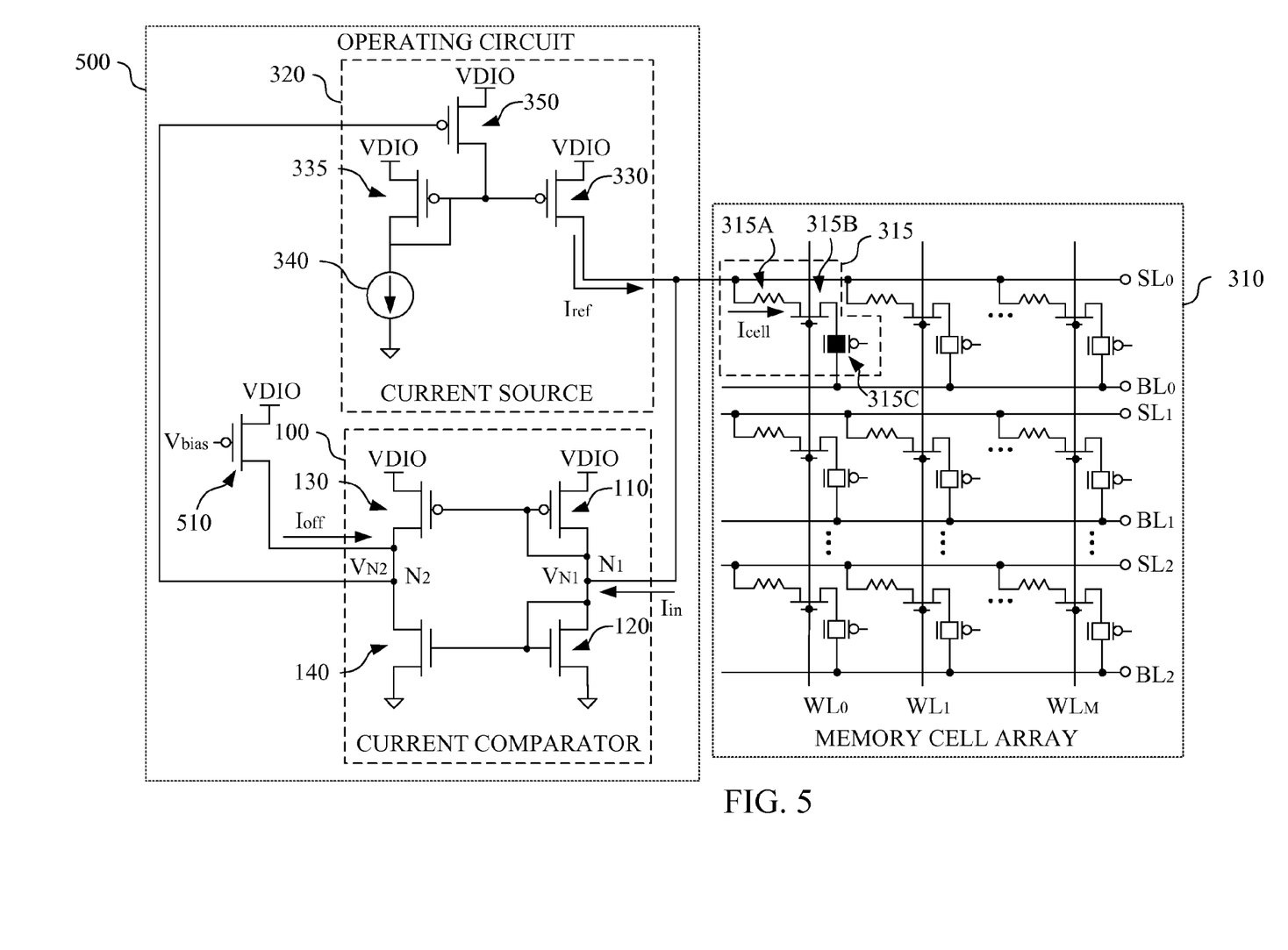
FIG. 5 is an exemplary diagram of an operating circuit together with the resistive memory cell array in accordance of various embodiments of the present disclosure.

FIG. 5 is an exemplary diagram of an operating circuit 500 together with the resistive memory cell array 310 in accordance of various embodiments of the present disclosure. In some embodiments, the operating circuit 500 operates the resistive memory cell array 310.

The resistive memory cell array 310 includes substantially the same components as those of the resistive memory cell array 310 illustrated in FIG. 5. As a result, a resistive memory cell 315 in a row is conducted according to the voltage applied to the corresponding word line and the transmission gate 315C. For illustration, the corresponding source line of the conducted resistive memory cell 315 is driven by a driving current $I_{ref}$ in FIG. 5. The reset operation is performed on one of the conducted resistive memory cells 315 in the row corresponding to the source line $SL_0$ according to the driving current $I_{ref}$. More specifically, the resistive state of the conducted resistive memory cells 315 gradually switches from a low resistive state to a high resistive state according to the driving current $I_{ref}$.

For illustration in FIG. 5, the driving current $I_{ref}$ is generated by the operating circuit 500 used to operate the resistive memory cells 315. Actually, each of the source lines $SL_0$-$SL_N$ is connected to a corresponding operating circuit. For convenience of illustration, only one reference number 315 is labeled in FIG. 5.

The operating circuit 500 substantially includes the same components as those of the operating circuit 500 except that the operating circuit 500 further includes a bias current source 510. In some embodiments, the bias current source 510 is a P-type metal-oxide-semiconductor (PMOS) transistor and is connected to the output node $N_2$ to generate an offset current $I_{off}$ thereto according to a bias voltage $V_{bias}$.

Moreover, as illustrated in FIG. 5, the output node $N_2$ is directly connected to the control switch 350. For illustration in FIG. 5, the control switch 350 is controlled by the voltage $V_{N2}$ of the output node $N_2$, and then the control switch 350 further controls the operation of the transistor 330.

Figure 6:
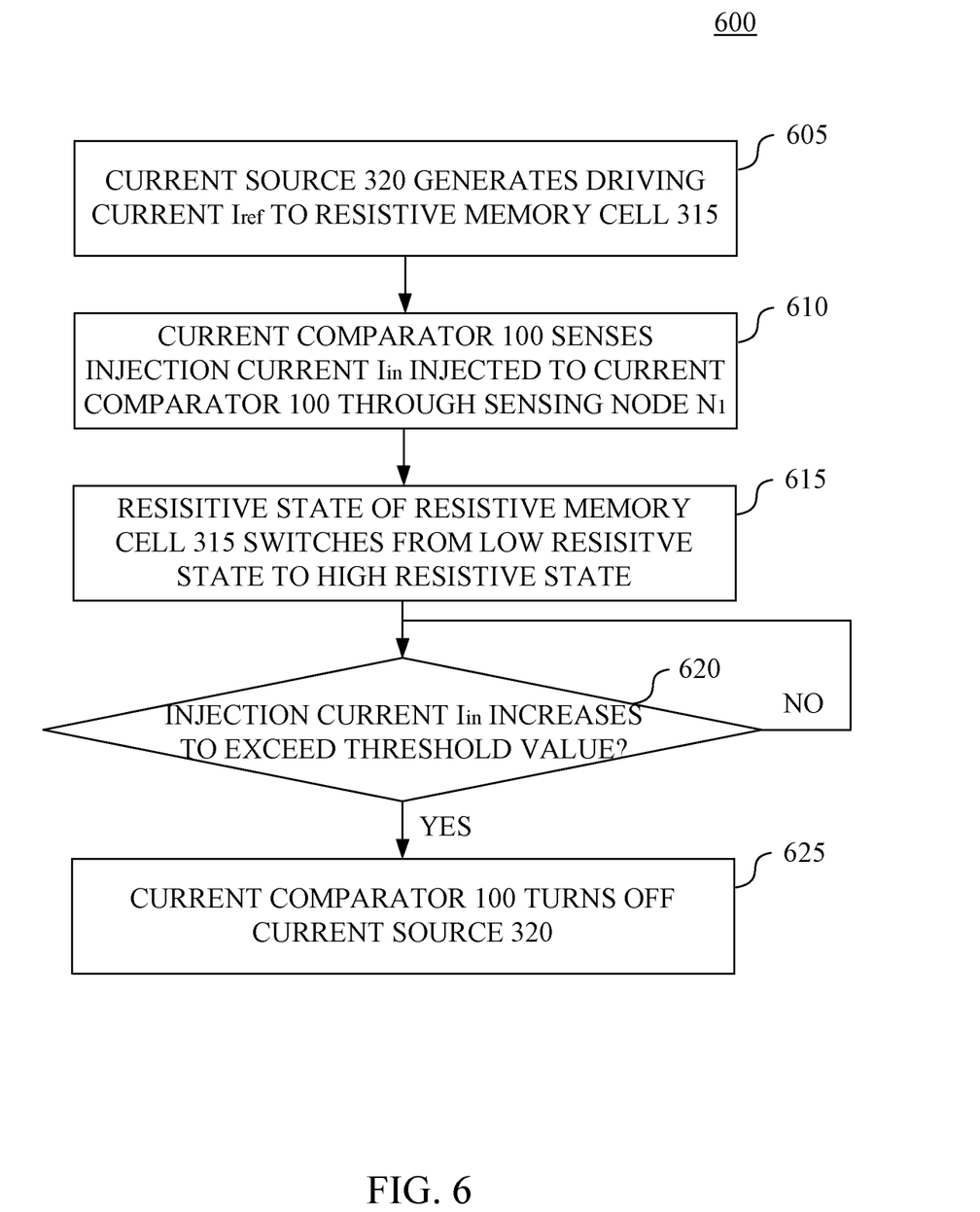
FIG. 6 is a flow chart of an operating method in accordance with various embodiments of the present disclosure.

FIG. 6 is a flow chart of an operating method 600 in accordance with various embodiments of the present disclosure. In some embodiments, the operating method 600 is applied in the operating circuit 500 illustrated in FIG. 5. For illustration, operations of the operating circuit 500 with one of the resistive memory cells 315 illustrated in FIG. 5 are described by the operating method 600.

In operation 605, the current source 320 generates the driving current $I_{ref}$ to a conducted resistive memory cell 315. More specifically, the transistor 330 of the current source 320 generates the driving current $I_{ref}$ to the conducted resistive memory cell 315. For illustration, one of the resistive memory cells 315 in FIG. 5 is conducted to perform the reset operation.

For illustration in FIG. 3, the resistive memory cell 315 associated with the source line $SL_0$ and the word line $WL_0$ is conducted. In such condition, the access transistor 315B and the transmission gate 315C are activated. As a result, the resistive random access memory (RRAM) device 315A is conducted. Consequently, the resistive memory cell 315 is conducted, and a current $I_{cell}$ flows through the conducted resistive memory cell 315. In some embodiments, the current $I_{cell}$ flows from the source line $SL_0$ to the bit line $BL_0$.

In operation 610, the current comparator 100 senses an injection current $I_{in}$ injected to the current comparator 100 through the sensing node $N_1$.

When the resistive memory cell 315 is in a low resistive state, the resistive random access memory (RRAM) device 315A drains a large amount of current $I_{cell}$. As a result, only a small part of the driving current $I_{ref}$ generated by the current source 320 is injected to the sensing node $N_1$ such that current comparator 100 senses the injection current $I_{in}$.

Since the voltage $V_{N2}$ of the output node $N_2$ is increased by the offset current $I_{off}$, the P-type metal-oxide-semiconductor (PMOS) transistor 130 is not turned off by the voltage $V_{N1}$ of the sensing node $N_1$ generated according to the injection current $I_{in}$. As a result, the diode-connected P-type metal-oxide-semiconductor (PMOS) transistor 110 and the second P-type metal-oxide-semiconductor (PMOS) transistor 130 are turned on. Moreover, the voltage $V_{N2}$ of the output node $N_2$ is pulled high by the P-type metal-oxide-semiconductor (PMOS) transistor 130. The control switch 350 is turned off by the voltage $V_{N2}$ of the output node $N_2$ to keep turning on the current source 320. More specifically, the control switch 350 is turned off to keep turning on the transistor 330 of the current source 320.

In operation 615, a resistive state of the resistive memory cell 315 switches from a low resistive state to a high resistive state according to the driving current $I_{ref}$.

For illustration, when the current source 320 keeps generating the driving current $I_{ref}$, the corresponding resistive memory cell 315 gradually switches from the low resistive state to the high resistive state. As a result, the current $I_{cell}$ drained by the resistive memory cell 315 decreases such that the injection current $I_{in}$ injected to the current comparator 100 increases.

In operation 620, whether an amount of the injection current $I_{in}$ increases to exceed a threshold value is determined when a resistive state of the resistive memory cell 315 switches from the low resistive state to the high resistive state.

In operation 625, the current comparator 100 turns the current source 320 off when the amount of the injection current $I_{in}$ exceeds the threshold value.

When the amount of the injection current $I_{in}$ increases to exceed the threshold value, both the diode-connected P-type metal-oxide-semiconductor (PMOS) transistor 110 and the P-type metal-oxide-semiconductor (PMOS) transistor 130 turns off. As a result, the N-type metal-oxide-semiconductor (NMOS) transistor 140 pulls the voltage state of the voltage $V_{N2}$ of the output node $N_2$ from a high voltage state to a low voltage state. The control switch 350 is turned off by the low voltage state of the voltage $V_{N2}$, such that the control switch 350 pulls the gate voltages of the transistor 330 and the transistor 335 to a high level to turn off the current source 320.

On the contrary, if it is determined that the amount of the injection current $I_{in}$ is not above the threshold value in operation 415, the current comparator 100 keeps turning on the current source 320 until the injection current $I_{in}$ reaches the threshold value.

Based on the operation of the operating circuit 500, the current comparator 100 turns off the current source 320 after the resistive state of the resistive memory cell 315 switches. The resistive memory cell 315 is not suffered from the over-reset condition.

The amount of the threshold value therein in this document is for illustrative purposes. Various amounts of the threshold value therein are within the contemplated scope of the present disclosure. For example, the amount of the threshold value is modified by using different size ratios of the MOS transistors in the current comparator 100.

In some embodiments, the amount of the threshold value is modified by controlling the amount of the offset current $I_{off}$. Moreover, in some embodiments, the bias current source 510 that generates the offset current $I_{off}$ can be applied to the operating circuit 300 under the condition of proper adjustment of the circuit configuration.

In some embodiments, a circuit is disclosed that includes a first diode-connected P-type metal-oxide-semiconductor (PMOS) transistor, a first diode-connected N-type metal-oxide-semiconductor (NMOS) transistor, a second P-type metal-oxide-semiconductor (PMOS) transistor and a second N-type metal-oxide-semiconductor (NMOS) transistor. The first diode-connected P-type metal-oxide-semiconductor (PMOS) transistor and the first diode-connected N-type metal-oxide-semiconductor (NMOS) transistor are cascade-connected at a sensing node, wherein the sensing node senses an injection current injected through the sensing node. The second P-type metal-oxide-semiconductor (PMOS) transistor and the second N-type metal-oxide-semiconductor (NMOS) transistor are cascade-connected at an output node, wherein the gates of the first diode-connected P-type metal-oxide-semiconductor (PMOS) transistor and the second P-type metal-oxide-semiconductor (PMOS) transistor are connected and the gates of the first diode-connected N-type metal-oxide-semiconductor (NMOS) transistor and the second N-type metal-oxide-semiconductor (NMOS) transistor are connected. When an amount of the injection current increases to exceed or decreases to reach a threshold value, a voltage state of a voltage of the output node switches.

Also disclosed is a circuit that includes a current source and a current comparator. The current source is connected to a resistive memory cell to generate a driving current thereto. The current comparator has a sensing node connected to the current source and the resistive memory cell to sense an injection current injected to the current comparator through the sensing node, wherein when a resistive state of the resistive memory cell switches such that the current comparator determines that an amount of the injection current increases to exceed or decreases to reach a threshold value, the current comparator turns off the current source.

Also disclosed is a method that includes the operations outlined below. A driving current is generated to a resistive memory cell by a current source. An injection current injected to the current comparator through a sensing node of the current comparator is sensed, wherein the sensing node is connected to the current source and the resistive memory cell. A resistive state of the resistive memory cell is switched. An amount of the injection current is determined to be increased to be above or decreased to reach a threshold value. The current source is turned off by the current comparator.

In this document, the term "connected" may be termed as "electrically connected", and the term "coupled" may be termed as "electrically coupled". "Connected" and "coupled" may also be used to indicate that two or more elements cooperate or interact with each other.

The number and configuration of the resistive memory cells and the resistive memory cell array therein in this document are for illustrative purposes. Various numbers and configurations of the resistive memory cells and the resistive memory cell array therein are within the contemplated scope of the present disclosure.

The above illustrations include exemplary operations, but the operations are not necessarily performed in the order shown. Operations may be added, replaced, changed order, and/or eliminated as appropriate, in accordance with the spirit and scope of various embodiments of the present disclosure.

As is understood by one of ordinary skill in the art, the foregoing embodiments of the present disclosure are illustrative of the present disclosure rather than limiting of the present disclosure. It is intended to cover various modifications and similar arrangements included within the spirit and scope of the appended claims, the scope of which should be accorded with the broadest interpretation so as to encompass all such modifications and similar structures.

What is claimed is:

1. A circuit comprising:
    a first diode-connected P-type metal-oxide-semiconductor (PMOS) transistor and a first diode-connected N-type metal-oxide-semiconductor (NMOS) transistor cascade-connected at a sensing node, wherein the sensing node senses an injection current injected through the sensing node from or to an external circuit; and
    a second P-type metal-oxide-semiconductor (PMOS) transistor and a second N-type metal-oxide-semiconductor (NMOS) transistor cascade-connected at an output node, wherein the gates of the first diode-connected P-type metal-oxide-semiconductor (PMOS) transistor and the second P-type metal-oxide-semiconductor (PMOS) transistor are connected and the gates of the first diode-connected N-type metal-oxide-semiconductor (NMOS) transistor and the second N-type metal-oxide-semiconductor (NMOS) transistor are connected;
    wherein when an amount of the injection current increases to exceed or decreases to reach a threshold value, a voltage state of a voltage of the output node switches.

2. The circuit of claim 1, wherein when the injection current is of a positive value, the voltage state of the voltage of the output node switches from a low voltage state to a high voltage state when the amount of the injection decreases to reach the threshold value and the voltage state of the voltage of the output node switches from a high voltage state to a low voltage state when the amount of the injection current increases to exceed the threshold value.

3. The circuit of claim 1, wherein when the injection current is of a negative value, the voltage state of the voltage of the output node switches from a high voltage state to a low voltage state when the amount of the injection decreases to reach the threshold value and the voltage state of the voltage of the output node switches from a low voltage state to a high voltage state when the amount of the injection current increases to exceed the threshold value.

4. The circuit of claim 1, further comprising a bias current source connected to the output node to generate an offset current to the output node.

5. The circuit of claim 1, further comprising a bias current source connected to the output node to drain an offset current from the output node.

6. A circuit comprising:
a current source connected to a resistive memory cell to generate a driving current thereto; and
a current comparator having a sensing node connected to the current source and the resistive memory cell to sense an injection current injected to the current comparator through the sensing node, wherein when a resistive state of the resistive memory cell switches such that the current comparator determines that an amount of the injection current increases to exceed or decreases to reach a threshold value, the current comparator turns off the current source.

7. The circuit of claim 6, wherein the resistive state of the resistive memory cell switches from a high resistive state to a low resistive state such that the amount of the injection current decreases to reach the threshold value, and a voltage state of a voltage of an output node of the current comparator switches to turn off the current source.

8. The circuit of claim 6, wherein the resistive state of the resistive memory cell switches from a low resistive state to a high resistive state such that the amount of the injection current increases to exceed the threshold value, and a voltage state of a voltage of an output node of the current comparator switches to turn off the current source.

9. The circuit of claim 6, further comprising a control switch connected to the current source, wherein a voltage of an output node controls the control switch to turn off the current source when a voltage state of the voltage of the output node switches.

10. The circuit of claim 9, wherein the current source comprises a current mirror comprising:
an output branch comprising a first transistor connected to the resistive memory cell to generate the driving current thereto; and
a reference branch comprising a second transistor and a reference current source connected in series;
wherein the first transistor generates the driving current according to the reference current source, and the control switch is connected to the gate of the first transistor and the gate of the second transistor to turn off the first transistor after the voltage state of the voltage of the output node switches.

11. The circuit of claim 6, wherein the current comparator comprises:
a first diode-connected P-type metal-oxide-semiconductor (PMOS) transistor and a first diode-connected N-type metal-oxide-semiconductor (NMOS) transistor cascade-connected at the sensing node; and a second P-type metal-oxide-semiconductor (PMOS) transistor and a second N-type metal-oxide-semiconductor (NMOS) transistor cascade-connected at an output node, wherein the gates of the first diode-connected P-type metal-oxide-semiconductor (PMOS) transistor and the second P-type metal-oxide-semiconductor (PMOS) transistor are connected and the gates of the first diode-connected N-type metal-oxide-semiconductor (NMOS) transistor and the second N-type metal-oxide-semiconductor (NMOS) transistor are connected;
wherein when the resistive state of the resistive memory cell switches such that the amount of the injection current increases to exceed or decreases to reach the threshold value, a voltage state of a voltage of the output node switches to turn off the current source.

12. The circuit of claim 11, wherein when the voltage of the output node switches, the switched voltage serves as an inhibiting signal to notify a monitoring end that an operation of the current source and the resistive memory cell is done.

13. The circuit of claim 11, wherein the current comparator further comprises a bias current source connected to the output node to generate an offset current to the output node.

14. A method comprising:
generating a driving current to a resistive memory cell by a current source;
sensing an injection current injected to the current comparator through a sensing node of the current comparator, wherein the sensing node is connected to the current source and the resistive memory cell;
switching a resistive state of the resistive memory cell;
determining that an amount of the injection current increases to exceed or decreases to reach a threshold value; and
turning off the current source by the current comparator.

15. The method of claim 14, further comprising:
switching a voltage state of a voltage of an output node of the comparator to turn off the current source.

16. The method of claim 14, further comprising:
generating an offset current to the output node.

17. The method of claim 14, further comprising:
sensing that the amount of the injection current decreases to reach the threshold value when the resistive state of the resistive memory cell switches from a high resistive state to a low resistive state; and
switching the voltage state of the voltage of the output node to turn off the current source.

18. The method of claim 14, further comprising:
sensing that the amount of the injection current increases to exceed the threshold value when the resistive state of the resistive memory cell switches from a low resistive state to a high resistive state; and
switching the voltage state of the voltage of the output node to turn off the current source.

19. The method of claim 14, wherein the current source comprises a current mirror, the method further comprises:
generate the driving current by a first transistor of an output branch of the current mirror connected to the resistive memory cell according to a current of a reference branch of the current mirror having a second transistor and a reference current source.

20. The method of claim 14, further comprising turning off the first transistor after the voltage state of the voltage of the output node switches by a control switch connected to the gate of the first transistor and the gate of the second transistor.

* * * * *